(12) United States Patent
Hwang et al.

(10) Patent No.: US 9,188,607 B2
(45) Date of Patent: Nov. 17, 2015

(54) SUBSTRATE AND METHOD FOR MANUFACTURING THE SAME, AND PROBE CARD

(75) Inventors: Gyu Man Hwang, Gyeonggi-do (KR); Ji Hwan Shin, Gyeonggi-do (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 355 days.

(21) Appl. No.: 13/482,353

(22) Filed: May 29, 2012

(65) Prior Publication Data

US 2013/0141079 A1 Jun. 6, 2013

(30) Foreign Application Priority Data

Dec. 5, 2011 (KR) ........................ 10-2011-0129139

(51) Int. Cl.
   *G01R 3/00* (2006.01)
   *G01R 1/073* (2006.01)

(52) U.S. Cl.
   CPC .............. *G01R 3/00* (2013.01); *G01R 1/07378* (2013.01); *Y10T 428/2462* (2015.01)

(58) Field of Classification Search
   CPC ................................ G01R 1/073; H01L 21/00
   USPC ........................................ 324/756.01–756.07
   See application file for complete search history.

(56) References Cited

U.S. PATENT DOCUMENTS

| | | | |
|---|---|---|---|
| 2001/0044225 A1* | 11/2001 | Eldridge et al. | 439/66 |
| 2006/0076967 A1* | 4/2006 | Matsuda | 324/754 |
| 2009/0224410 A1* | 9/2009 | Johnson | 257/774 |
| 2009/0237099 A1* | 9/2009 | Garabedian et al. | 324/754 |

FOREIGN PATENT DOCUMENTS

| | | | |
|---|---|---|---|
| JP | 2003-305851 | 10/2003 | |
| JP | 2010-070392 | * 3/2010 | ............. H01L 21/66 |
| JP | 2011-204889 | 10/2011 | |
| KR | 10-2004-0057634 | 7/2004 | |
| KR | 10-0806736 | 2/2008 | |
| KR | 10-2009-0126492 | 12/2009 | |
| KR | 10-2010-0105223 | 9/2010 | |

OTHER PUBLICATIONS

Japanese Office Action issued Oct. 1, 2013 in corresponding Japanese Patent Application No. 2012-119352.
Korean Office Action issued Apr. 8, 2013 in corresponding Korean Patent Application No. 10-2011-0129139.

* cited by examiner

*Primary Examiner* — Tung X Nguyen
*Assistant Examiner* — Alesa Allgood
(74) *Attorney, Agent, or Firm* — McDermott Will & Emery LLP

(57) ABSTRACT

A substrate and a method for manufacturing the same, and a probe card employing the substrate as a space transformer. The substrate includes: a substrate body; a key forming groove formed in one surface of the substrate body; and an alignment key formed on the key forming groove. The recognition rate of the alignment key formed on the substrate can be increased, resulting in improved accuracy in a micro electro mechanical system (MEMS) process for forming micro probes on the substrate, thereby improving productivity and reliability of the substrate and the probe card including the same.

11 Claims, 9 Drawing Sheets

- PRIOR ART -

- PRIOR ART -

- PRIOR ART -

- PRIOR ART -

- PRIOR ART -

- PRIOR ART -

- PRIOR ART -

- PRIOR ART -

- PRIOR ART -

SUBSTRATE AND METHOD FOR MANUFACTURING THE SAME, AND PROBE CARD

CROSS REFERENCE(S) TO RELATED APPLICATIONS

This application claims the benefit under 35 U.S.C. Section 119 of Korean Patent Application Ser. No. 10-2011-0129139, entitled "Substrate and Method for Manufacturing the Same, and Probe Card" filed on Dec. 5, 2011, which is hereby incorporated by reference in its entirety into this application.

BACKGROUND OF THE INVENTION

1. Technical Field

The present invention relates to a substrate and a method for manufacturing the same, and a probe card including the substrate, and more particularly to a substrate and a method for manufacturing the same, and a probe card including the substrate, capable of increasing the recognition rate of alignment keys formed on a substrate to improve accuracy in a micro electro mechanical system (MEMS) process of forming a micro probe on the substrate.

2. Description of the Related Art

In general, a semiconductor device is manufactured by a fabrication process of forming, on a wafer, circuit patterns and connection pads for testing and an assembly process of assembling the wafer on which the circuit patterns and the connection pads are formed into respective semiconductor chips.

A test process of testing electric properties of the wafer by applying an electric signal to the connection pads formed on the wafer is performed between the fabrication process and the assembly process.

The test process is performed in order to remove a part of the wafer at which defects occur at the time of the assembly process.

A so-called tester applying an electric signal to the wafer and a so-called probe card functioning as an interface between the wafer and the tester are mainly used in the test process.

Between them, the probe card includes a printed circuit board receiving the electric signal applied from the tester, and a plurality of probes contacted with connection pads formed on the wafer.

In recent, a circuit pattern formed on the wafer by the fabrication process is highly integrated due to the increased demand for highly integrated semiconductor chips, and as a result, a distance between adjacent connection pads, that is, a pitch becomes very narrow.

In order to test fine-pitch connection pads, the probes of the probe card are also finely formed.

Hereinafter, a general probe card will be described in detail with reference to the accompanying drawings, FIGS. 1 to 7B, as follows.

As shown in FIG. 1, a general probe card 10 includes: a printed circuit board 1 to which an electric signal is applied from the outside; a space transformer (STF) 3 having a plurality of micro probes 2 contacted with connection pads of a test object (not shown) such as a semiconductor chip; and an interface member 4 electrically connecting the printed circuit board 1 and the space transformer 3.

Here, the space transformer 3 is an electronic circuit board electrically connecting the printed circuit board 1 and the plurality of micro probes 2 having a size of several tens of micrometers in the middle portion thereof. Several tens of thousands of highly integrated micro probes may be formed by using a micro electro mechanical system (MEMS) process and a semiconductor process.

In other words, referring to FIG. 2, the space transformer 3 made of a ceramic substrate is prepared, and a conductive material 31 is provided on an upper surface of the space transformer 3. Then, a photosensitive film (dry film resist (DFR)) 32 is attached onto the conductive material 31.

Then, the photosensitive film 32 is patterned by performing an exposure process using a mask 33 and a development process on the photosensitive film 32.

Then, an etching process is performed thereon, to remove a part of the conductive material 31 on which the photosensitive film is not patterned, and then, the patterned photosensitive film 32 is stripped off, thereby forming a land pattern on the space transformer 3. A plurality of micro probes are embodied on the land pattern, and thus a plurality of micro probes 2 can be formed on the space transformer 3.

Here, in order to perform an electric test process by forming several tens of thousands of highly integrated micro probes 2 on the space transformer 3 and contacting the micro probes 2 with fine-pitch connection pads of a semiconductor chip, the micro probes 2 need to be formed at accurate positions of the space transformer 3.

To achieve this, as shown in FIG. 3, an alignment key 3a may be formed on the space transformer 3. The alignment key 3a is recognized in the MEMS process for forming the micro probes, so that positions at which the micro probes are to be formed on the space transformer 3 can be accurately caught.

More specifically, referring to FIG. 4, a process of manufacturing the alignment key and the micro probes on the space transformer will be described as follows.

First, a space transformer (STF) is prepared, and then a laser process is performed on the space transformer to form an alignment key at an outer perimeter region of the space transformer.

In addition, in order to perform an MEMS process well or the like on the space transformer, a surface of the space transformer is polished and then the alignment key is recognized, so that positions at which the micro probes are to be formed on the space transformer 3 can be accurately caught.

Then, the above-described MEMS process is performed to form micro probes at the micro probe formation positions caught on the space transformer.

Here, a surface of the spacer transformer is polished by about 30 to 40 μm, in order to remove foreign particles on the surface of the space transformer and smoothly perform the MEMS process. At this time, as shown in FIG. 5, the alignment key 3a is polished together with the spacer transformer 3, with the result that, after the polishing process of the space transformer 3, the alignment key 3 is removed or a shape thereof is changed.

In other words, the alignment key 3a is clearly recognizable before the polishing process of the space transformer 3, as shown in FIG. 5A, but the alignment key 3a may be damaged and unrecognizable after the polishing process of the space transformer 3, as shown in FIG. 5B. As such, since the alignment key 3a is difficult to recognize when the MEMS process is performed on the space transformer 3, it is difficult to catch the positions at which the micro probes are to be formed on the space transformer 3.

For solving this, as shown in FIG. 6, the alignment key 3a is formed more deeply at the time of processing of the alignment key 3a in the space transformer 3, considering the polishing process depth.

In other words, in a case where the polishing process depth of the space transformer 3 is about 30 μm, the alignment key 3a is processed to have a depth of about 50 μm.

However, in the case where the alignment key 3a is deeply processed, the working force of laser becomes strengthened and the number of processes becomes increased, and thus, the alignment key 3a becomes partially melted and collapses due to the heat of the laser, as shown in FIG. 7A. As a result, the recognition rate for the alignment key is decreased, and thus, it is difficult to precisely and accurately form the micro probes on the space transformer 3.

Furthermore, when the polishing process is performed on the space transformer 3 while the alignment key 3a is partially melted and collapses, foreign particles, that is, ceramic pieces or the like, which are generated when the space transformer 3 is polished, are put in a groove of the alignment key 3a, as shown in FIG. 7B. As a result, the recognition rate for the alignment key is decreased, and thus, it is difficult to precisely and accurately form the micro probes on the space transformer 3.

SUMMARY OF THE INVENTION

An object of the present invention is to provide a substrate and a method for manufacturing the same, and a probe card including the substrate, capable of increasing the recognition rate of the alignment key formed on the substrate.

Another object of the present invention is to provide a substrate and a method for manufacturing the same, and a probe card including the substrate, capable of improving accuracy and precision in a MEMS process for forming micro probes by increasing the recognition rate of the alignment key, thereby increasing productivity and improving product reliability.

According to an exemplary embodiment of the present invention, there is provided a substrate, including: a substrate body; a key forming groove formed in one surface of the substrate body; and an alignment key formed on the key forming groove.

The substrate body may be formed of an alumina ceramic material, and may include a high-temperature co-fired ceramic (HTTC) or a low-temperature co-fired ceramic (LTCC).

The key forming groove may be formed by machining using a machining center (MCT).

The key forming groove may have a circular cross section with a diameter of 3 to 5 mm, and the key forming groove may be formed in a depth of 50 to 200 μm.

The alignment key may be formed on a bottom surface of the key forming groove by laser processing.

According to another exemplary embodiment of the present invention, there is provided a method for manufacturing a substrate, including: preparing a substrate body; forming a key forming groove in one surface of the substrate body; forming an alignment key on the key forming groove; and polishing one surface of the substrate body.

Here, a polished depth by which one surface of the substrate body is polished may be smaller than a depth of the key forming groove.

The polished depth by which one surface of the substrate body is polished may be 30 to 40 μm in a case where the key forming groove has a depth of 50 μm.

The method may further include, after the polishing of the one surface of the substrate body, forming micro probes at probe formation positions of the substrate body recognized through the alignment key, the micro probes being contacted with connection pads of a semiconductor chip.

According to still another exemplary embodiment of the present invention, there is provided a probe card, including: a printed circuit board to which an electric signal is applied from the outside; a space transformer (STF) having a plurality of micro probes contacted with a test object; and an interface member electrically connecting the printed circuit board and the space transformer to each other, wherein the space transformer includes: a substrate body electrically connected to the printed circuit board through the interface member, and including the plurality of micro probes; a key forming groove formed in the substrate body; and an alignment key formed on the key forming groove to provide a reference with respect to positions at which the plurality of micro probes are formed on the substrate body.

BRIEF DESCRIPTION OF THE DRAWINGS

FIG. 9A shows a cross sectional view and a plan view showing a state in which a key forming groove is formed in a substrate body;

FIG. 9B shows a cross sectional view and a plan view showing a state in which an alignment key is formed on the key forming groove of FIG. 9A;

FIG. 9C shows a cross sectional view and a plan view showing a state after the substrate body of FIG. 9B is polished.

DESCRIPTION OF THE PREFERRED EMBODIMENTS

Figure 1:
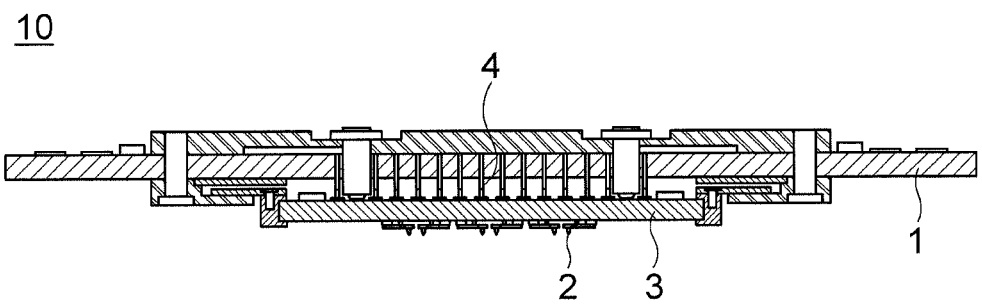
FIG. 1 is a cross sectional view schematically showing a general probe card.
Figure 2:
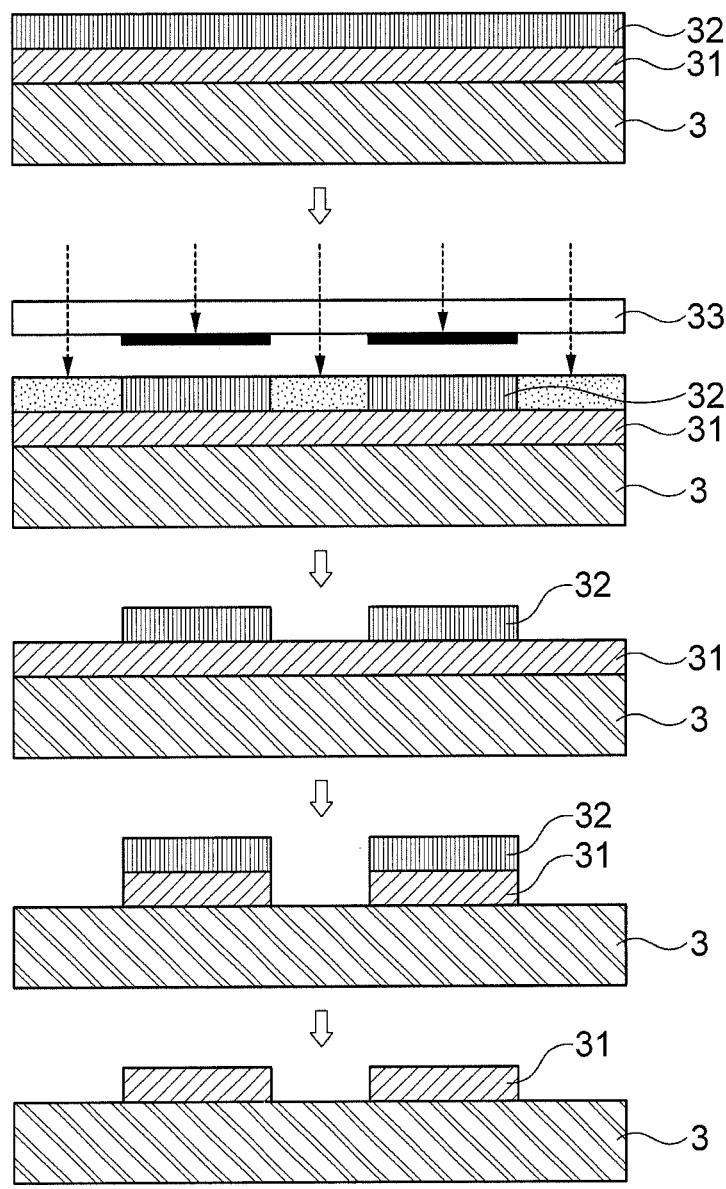
FIG. 2 shows cross sectional views schematically showing a process of forming a plurality of micro probes on a space transformer of FIG. 1.
Figure 3:
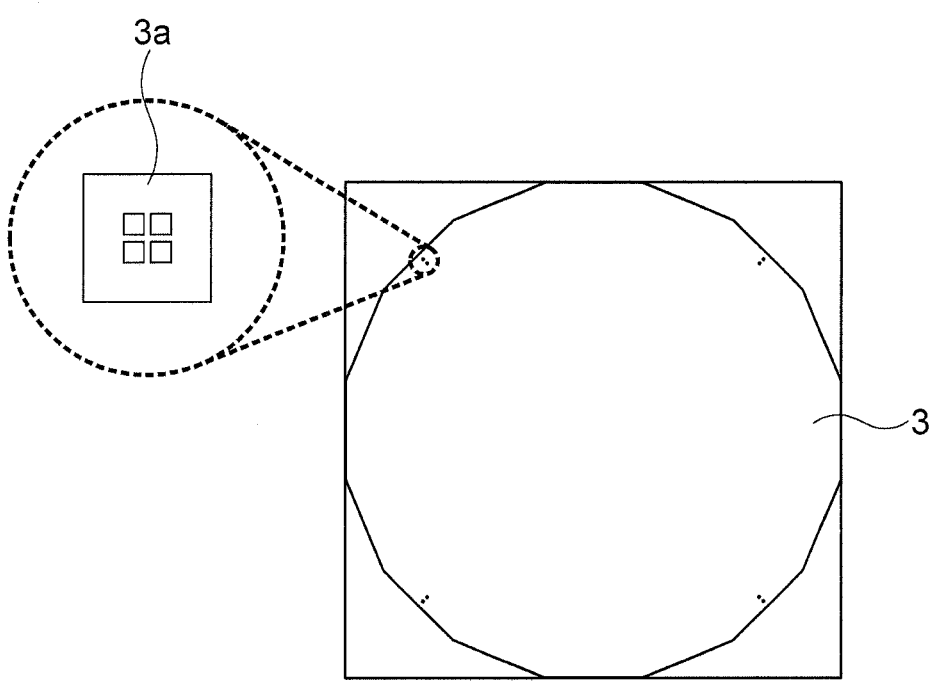
FIG. 3 is a plan view schematically showing the space transformer of FIG. 2.
Figure 4:
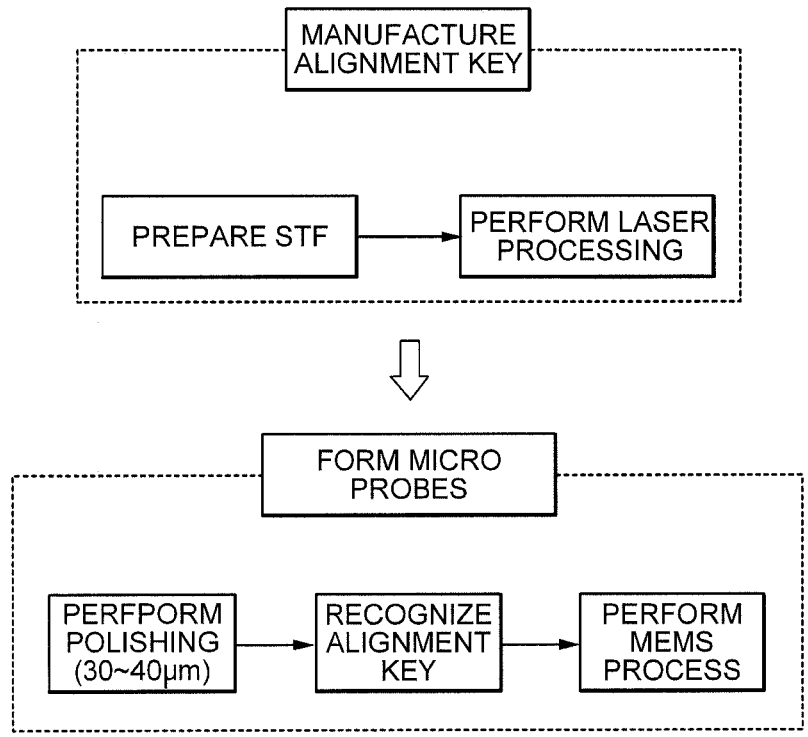
FIG. 4 is a process diagram schematically showing a method for manufacturing the space transformer of FIG. 2.
Figure 5A:
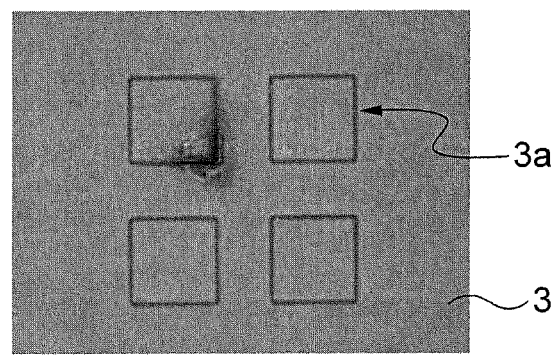
FIG. 5A is a picture showing an alignment key formed on the space transformer of FIG. 2.
Figure 5B:
FIG. 5B is a picture showing a state of the alignment key of FIG. 5A after a polishing process.
Figure 6:
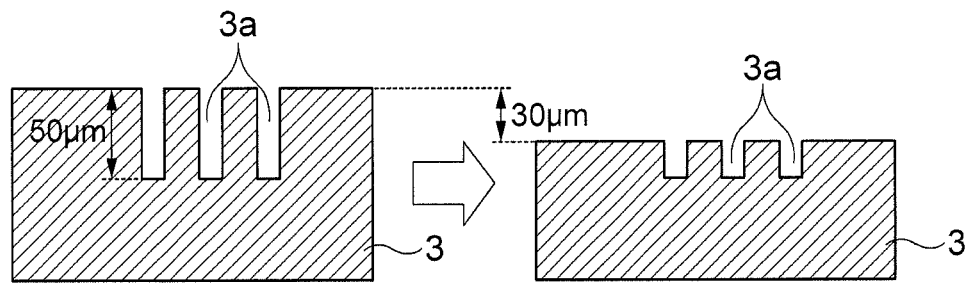
FIG. 6 show cross sectional views schematically showing another example for forming the alignment key on the space transformer.
Figure 7A:
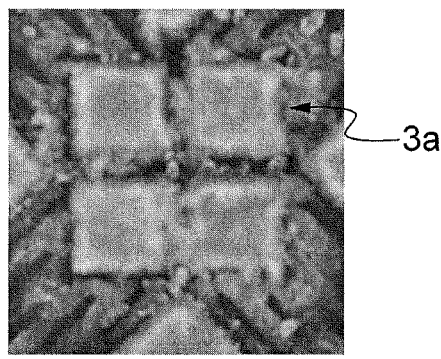
FIG. 7A is a picture showing an alignment key before the polishing process is performed in the procedure of FIG. 6.
Figure 7B:
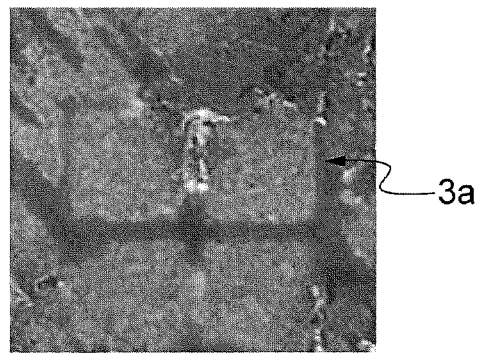
FIG. 7B is a picture showing an alignment key after the polishing process is performed in the procedure of FIG. 6.

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals in the drawings denote like elements.

Terms used in the present specification are for explaining the embodiments rather than limiting the present invention. In the specification, a singular type may also be used as a plural type unless stated specifically. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In the drawings, the thickness of layers and regions is exaggerated for efficient description of the technical contents. Therefore, exemplified forms may be changed by manufacturing technologies and/or tolerance. Therefore, the exemplary embodiments of the present invention are not limited to specific forms but may include the change in forms generated according to the manufacturing processes. For example, an etching region vertically shown may be rounded or may have a predetermined curvature. Furthermore, the regions illustrated in the drawings have schematic features, and the shapes of the illustrated regions in the drawings are for illustrating specific shapes and are not for limiting the scope of the present invention.

Hereinafter, a substrate and a method for manufacturing the same according to an exemplary embodiment of the present invention will be described in detail with reference to FIGS. 8 to 10.

Figure 8:
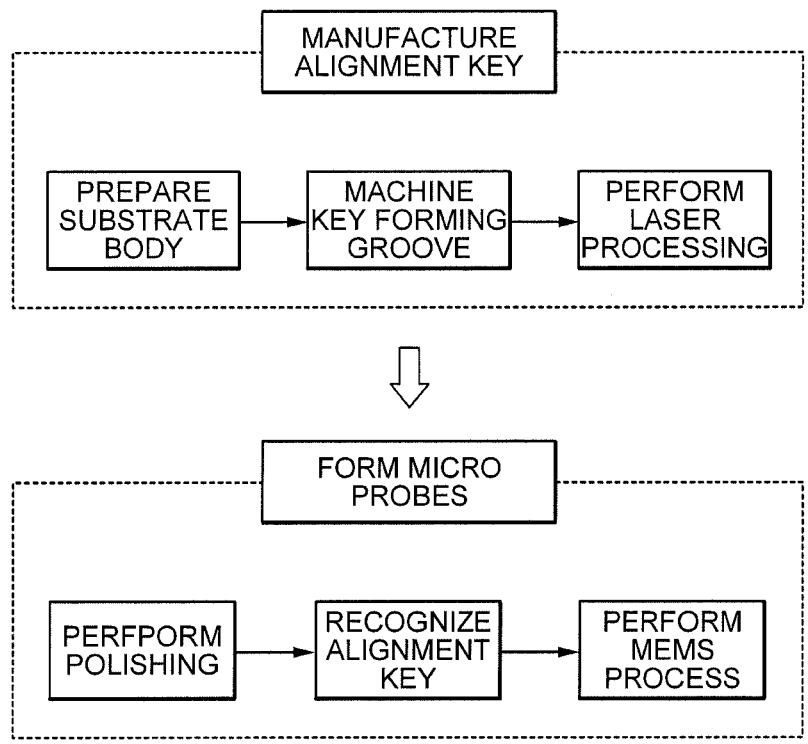
FIG. 8 is a process diagram schematically showing a method for manufacturing a substrate according to the present invention.
Figure 9A:
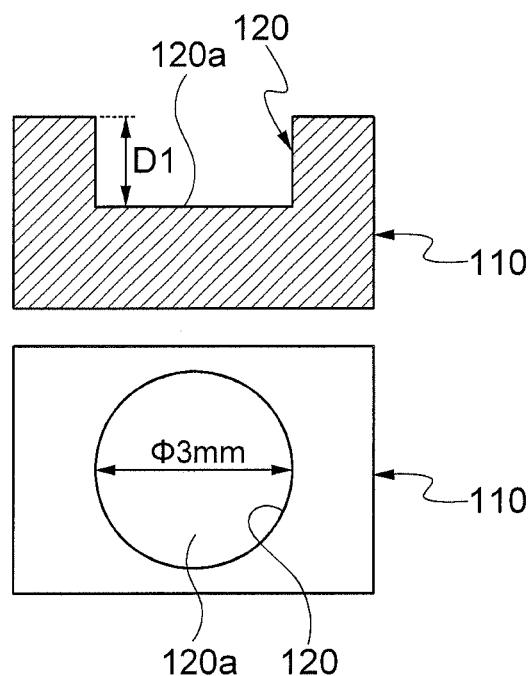
FIGS. 9A to 9C show cross sectional views and plan views sequentially showing the method for manufacturing a substrate according to the present invention.
Figure 9B:
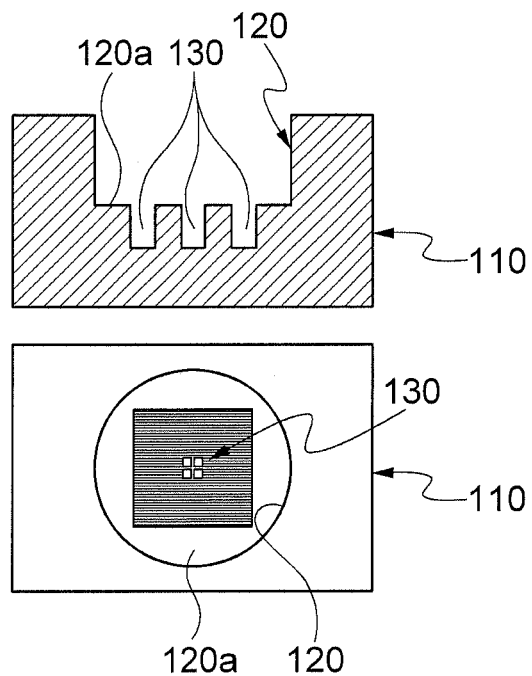
Figure 9C:
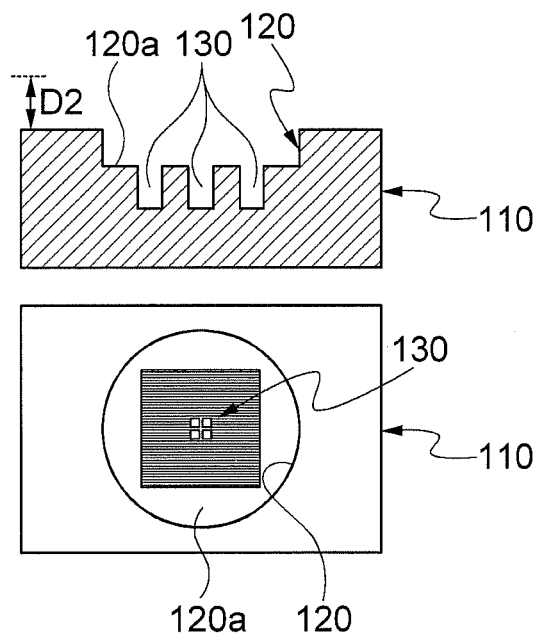

FIG. 8 is a process diagram schematically showing a method for manufacturing a substrate according to the present invention; FIGS. 9A to 9C show cross sectional views and plan views sequentially showing the method for manufacturing a substrate according to the present invention; FIG. 9A shows a cross sectional view and a plan view showing a state in which a key forming groove is formed in a substrate body; FIG. 9B shows a cross sectional view and a plan view showing a state in which an alignment key is formed on the key forming groove of FIG. 9A; FIG. 9C shows a cross sectional view and a plan view showing a state after the substrate body of FIG. 9B is polished; and FIG. 10 is a picture showing the alignment key formed on the substrate body by following the procedure shown in FIGS. 9A to 9C.

The substrate of the present exemplary embodiment may be configured into a space transformer to which a probe card is applied, and hence, in the present invention, a space transformer will be described in substitution for the substrate.

Certainly, the substrate of the present exemplary embodiment may be applied to all substrates having alignment keys thereon, and is not limited to a space transformer of a probe card.

Referring to FIGS. 8 to 9C, a substrate, that is, a space transformer 100 according to the present invention may mainly include a substrate body 110, a key forming groove 120 formed in one surface of the substrate body 110, and an alignment key 130 formed on the key forming groove 120.

The substrate body 110 may be formed of a ceramic substrate made of an alumina ceramic material, and particularly, may be constituted of a high-temperature co-fired ceramic (HTTC) or a low-temperature co-fired ceramic (LTCC), depending on the firing temperature.

The key forming groove 120 may be formed by machining, particularly machining using a machining center.

Here, the key forming groove 120 may have a circular cross section of which a diameter ($\phi$) is 3 to 5 mm.

In addition, the key forming groove 120 may be formed in a depth (D1) of 50 to 200 μm.

Meanwhile, the alignment key 130 may be formed on a bottom surface 120a of the key forming groove 120 by laser processing.

In the substrate, that is, the space transformer 100 of the present exemplary embodiment constituted as above, after laser processing of the alignment key 130 on the bottom surface 120a of the key forming groove 120; at least one surface of the substrate body 110 may be polished by a polishing process. Here, the polished depth (D2) of the substrate body 10 may be 30 to 40 μm.

Here, in order to prevent the alignment key 130 from being damaged by the polishing process, the polished depth (D2) by which one surface of the substrate body 110 is polished may be thinner, that is, smaller than the depth (D1) of the key forming groove 120.

For example, when the polished depth D2 by which one surface of the substrate body 110 is polished is 30 μm, the key forming groove 120 may be formed to have a depth of 50 μm.

Therefore, in the substrate, that is, the space transformer 100 according to the present exemplary embodiment, the recognition rate of the alignment key 130 is superior even after the polishing process, and thus, the positions at which micro probes (not shown) are to be formed on the space transformer 100 can be accurately caught. As a result, the micro probes can be formed at accurate positions on the space transformer 100.

A method for manufacturing the substrate, that is, the space transformer 100 constituted as above will be described in detail as follows.

First, the substrate body 110 is prepared, and the key forming groove 120 is formed in the substrate body 110 by using a machining apparatus such as a machining center.

Here, the key forming groove 120 may be formed to have a circular cross section of which a diameter ($\phi$) is 3 to 5 mm, and may be formed in a depth (D1) of 50 μm, but is not limited thereto.

Then, the alignment key 130 is formed on the bottom surface 120a of the key forming groove 120 by using a laser.

Then, the substrate body 110 is polished such that one surface of the substrate body 110 is smoothly processed.

Here, the polished depth (D2) by which one surface of the substrate body 110 is polished may be smaller than the depth (D1) of the key forming groove 120.

For example, in a case where the depth (D1) of the key forming groove 120 is 50 μm, the polished depth (D2) by which one surface of the substrate body 110 is polished may be 30 μm, but is not limited thereto.

Then, the micro probes (not shown) contacted with connection pads of a semiconductor chip may be formed at probe formation positions of the substrate body 110, which are recognized through the alignment key 130, by using a MEMS process or the like.

Figure 10:
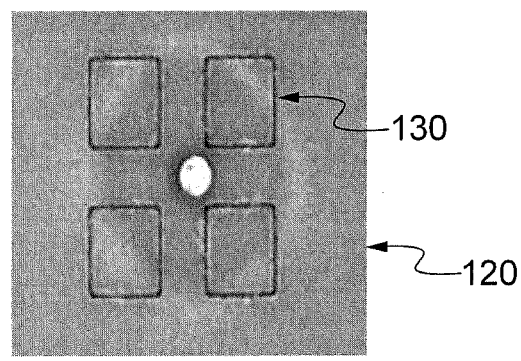
FIG. 10 is a picture showing the alignment key formed on the substrate body by following the procedure shown in FIGS. 9A to 9C.

As shown in FIG. 10, according to the space transformer 100 of the present exemplary embodiment, the alignment key 130 is formed on the key forming groove 120, thereby preventing the alignment key 130 from being damaged even after the polishing process, and thus, the recognition rate of the alignment key 130 is excellent. Therefore, the positions at which micro probes (not shown) are to be formed on the space transformer 100 can be accurately caught, and thus, accuracy and precision with respect to formation of the micro probes on the space transformer 100 can be improved.

Meanwhile, although not shown in detail, the substrate, that is, the space transformer 100 constituted and manufactured as above, can be applied to a probe card testing electric properties of the semiconductor chip, as a space transformer. This can be easily appreciated by those skilled in the art, and thus detailed descriptions thereof will be omitted.

As set forth above, according to the substrate and the method for manufacturing the same, and the probe card including the substrate, the alignment key is formed in the key forming groove, and thus, the recognition rate of the alignment key can be increased even after the polishing process.

Further, according to the substrate and the method for manufacturing the same, and the probe card including the substrate, accuracy and precision in a MEMS process for forming micro probes can be improved by increasing the recognition rate of the alignment key, thereby increasing productivity and improving product reliability.

The present invention has been described in connection with what is presently considered to be practical exemplary embodiments. Although the exemplary embodiments of the present invention have been described, the present invention may be also used in various other combinations, modifications and environments In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A substrate, comprising:
   a substrate body;
   a key forming groove formed in one surface of the substrate body; and
   an alignment key formed on a bottom surface of the key forming groove,
   wherein a step is formed in the one surface of the substrate body and a step is formed in the bottom surface of the key forming groove, and
   the key forming groove and the alignment key are both formed in one same layer of the substrate body.

2. The substrate according to claim 1, wherein the substrate body is formed of an alumina ceramic material, and includes a high-temperature co-fired ceramic (HTTC) or a low-temperature co-fired ceramic (LTCC).

3. The substrate according to claim 1, wherein the key forming groove is formed by machining using a machining center (MCT).

4. The substrate according to claim 1, wherein the alignment key is formed on a bottom surface of the key forming groove by laser processing.

5. The substrate according to claim 1, wherein the key forming groove has a circular cross section with a diameter of 3 to 5 mm.

6. The substrate according to claim 5, wherein the key forming groove is formed in a depth of 50 to 200 μm.

7. A method for manufacturing a substrate, comprising:
   preparing a substrate body;
   forming a key forming groove in one a surface of the substrate body;
   forming an alignment key on a bottom surface of the key forming groove; and
   polishing in such a way that the one surface of the substrate body and a bottom surface of the key forming groove have steps,
   wherein the key forming groove and the alignment key are both formed in one same layer of the substrate body.

8. The method according to claim 7, further comprising, after the polishing of the one surface of the substrate body, forming micro probes at probe formation positions of the substrate body recognized through the alignment key, the micro probes being contacted with connection pads of a semiconductor chip.

9. The method according to claim 7, wherein a polished depth by which one surface of the substrate body is polished is smaller than a depth of the key forming groove.

10. The method according to claim 9, wherein the polished depth by which one surface of the substrate body is polished is 30 to 40 μm in a case where the key forming groove has a depth of 50 μm.

11. A probe card, comprising:
   a printed circuit board to which an electric signal is applied from the outside;
   a space transformer (STF) having a plurality of micro probes contacted with a test object; and
   an interface member electrically connecting the printed circuit board and the space transformer to each other,
   wherein the space transformer includes:
   a substrate body electrically connected to the printed circuit board through the interface member, and including the plurality of micro probes;
   a key forming groove formed in the substrate body; and
   an alignment key formed on a bottom surface of the key forming groove to provide a reference with respect to positions at which the plurality of micro probes are formed on the substrate body,
   wherein a surface of the substrate body and a bottom surface of the key forming groove have steps, and
   the key forming groove and the alignment key are both formed in one same layer of the substrate body.

* * * * *